(12) United States Patent
Eichler et al.

(10) Patent No.: US 7,943,484 B2
(45) Date of Patent: May 17, 2011

(54) METHOD FOR LATERALLY CUTTING THROUGH A SEMICONDUCTOR WAFER AND OPTOELECTRONIC COMPONENT

(75) Inventors: Christoph Eichler, Tegernheim (DE); Volker Härle, Laaber (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 18 days.

(21) Appl. No.: 11/991,488

(22) PCT Filed: Aug. 7, 2006

(86) PCT No.: PCT/DE2006/001377
§ 371 (c)(1), (2), (4) Date: Apr. 29, 2009

(87) PCT Pub. No.: WO2007/025499
PCT Pub. Date: Mar. 8, 2007

(65) Prior Publication Data
US 2009/0290610 A1  Nov. 26, 2009

(30) Foreign Application Priority Data

Sep. 1, 2005 (DE) .......... 10 2005 041 572
Nov. 2, 2005 (DE) .......... 10 2005 052 357

(51) Int. Cl.
*H01L 21/30* (2006.01)

(52) U.S. Cl. .......... 438/458; 438/462; 438/455; 257/79; 257/E33.044

(58) Field of Classification Search ............ 257/13, 257/79–103, 918, E51.018–E51.022, E33.001–E33.077, 257/E33.054, E25.028, E25.032; 438/455–465
See application file for complete search history.

(56) References Cited

U.S. PATENT DOCUMENTS

| | | | |
|---|---|---|---|
| 5,374,564 | A | 12/1994 | Bruel |
| 6,150,239 | A | 11/2000 | Goesele et al. |
| 6,225,193 | B1 | 5/2001 | Simpson |
| 6,251,754 | B1 | 6/2001 | Ohshima et al. |
| 6,306,729 | B1 | 10/2001 | Sakaguchi et al. |
| 6,316,333 | B1 | 11/2001 | Bruel et al. |
| 6,362,077 | B1 | 3/2002 | Aspar et al. |

(Continued)

FOREIGN PATENT DOCUMENTS
DE  197 50 167  5/1999
(Continued)

OTHER PUBLICATIONS

W. Gotz et al., "Hydrogen passivation of Mg acceptors in GaN grown by metalorganic chemical vapor deposition", Appl. Phys. Letter, vol. 67, No. 18, pp. 2666-2668, Oct. 30, 1995.

(Continued)

*Primary Examiner* — N. Drew Richards
*Assistant Examiner* — Mamadou Diallo
(74) *Attorney, Agent, or Firm* — Cohen Pontani Lieberman & Pavane LLP

(57) ABSTRACT

A method for laterally dividing a semiconductor wafer (1) comprises the method steps of: providing a growth substrate (2); epitaxially growing a semiconductor layer sequence (3), which comprises a functional semiconductor layer (5), onto the growth substrate (2); applying a mask layer (10) to partial regions of the semiconductor layer sequence (3) in order to produce masked regions (11) and unmasked regions (12); implanting ions through the unmasked regions (12) in order to produce implantation regions (13) in the semiconductor wafer (1); and dividing the semiconductor wafer (1) along the implantation regions (13), wherein the growth substrate (2) or at least one part of the growth substrate (2) is separated from the semiconductor wafer.

35 Claims, 8 Drawing Sheets

U.S. PATENT DOCUMENTS

| | | |
|---|---|---|
| 6,559,075 B1 | 5/2003 | Kelly et al. |
| 6,815,309 B2 | 11/2004 | Letertre et al. |
| 6,858,107 B2 | 2/2005 | Ghyselen et al. |
| 7,229,899 B2 | 6/2007 | Moriceau et al. |
| 2002/0068201 A1 | 6/2002 | Vaudo et al. |
| 2003/0008477 A1 | 1/2003 | Kang et al. |
| 2003/0064535 A1 | 4/2003 | Kub et al. |
| 2003/0153163 A1 | 8/2003 | Letertre et al. |
| 2004/0005740 A1 | 1/2004 | Lochtefeld et al. |
| 2004/0033638 A1 | 2/2004 | Bader et al. |
| 2004/0104393 A1 | 6/2004 | Liu et al. |
| 2004/0241959 A1 | 12/2004 | Letertre et al. |
| 2005/0048739 A1 | 3/2005 | Kerdiles et al. |
| 2005/0217565 A1 | 10/2005 | Lahreche et al. |
| 2005/0282358 A1 | 12/2005 | Di Cioccio et al. |
| 2006/0172506 A1 | 8/2006 | Bruderl et al. |
| 2007/0048968 A1 | 3/2007 | Couillard et al. |

FOREIGN PATENT DOCUMENTS

| | | |
|---|---|---|
| DE | 199 59 182 | 6/2001 |
| DE | 100 51 465 | 5/2002 |
| DE | 10 329 884 | 3/2004 |
| DE | 10 2004 062290 | 7/2006 |
| EP | 0 994 503 | 4/2000 |
| EP | 1 324 385 | 12/2002 |
| FR | 2 758 907 | 7/1998 |
| JP | 2002-175985 | 6/2002 |
| TW | 200405409 A | 4/2004 |
| TW | 200414320 A | 8/2004 |
| WO | WO 98/14986 | 4/1998 |
| WO | WO 01/43185 | 6/2001 |
| WO | WO 03/100839 | 12/2003 |
| WO | WO 2004/010494 | 1/2004 |
| WO | WO 2004/061943 | 7/2004 |

OTHER PUBLICATIONS

S.M. Meyers et al., "The Behavior of ION-Implanted Hydrogen in Gallium Nitride", MRS Internet J. Nitride Semicond. Res. 4S1, G5.8, 1999.

A.Y. Polyakov et al., "Fermi level dependence of hydrogen diffusivity in GaN", Applied Physics Letters, vol. 79, No. 12, pp. 1834-1836, 2001.

C.H. Yun et al., "Transfer of patterned ion-cut silicon layers", Applied Physics Letters, vol. 73, No. 19, pp. 2772-2774, Nov. 9, 1998.

C.H. Yun et al., "Thermal and Mechanical Separations of Silicon Layers from Hydrogen Pattern-Implanted Wafers", Journal of Electronic Materials, vol. 30, No. 8, pp. 960-964, 2001.

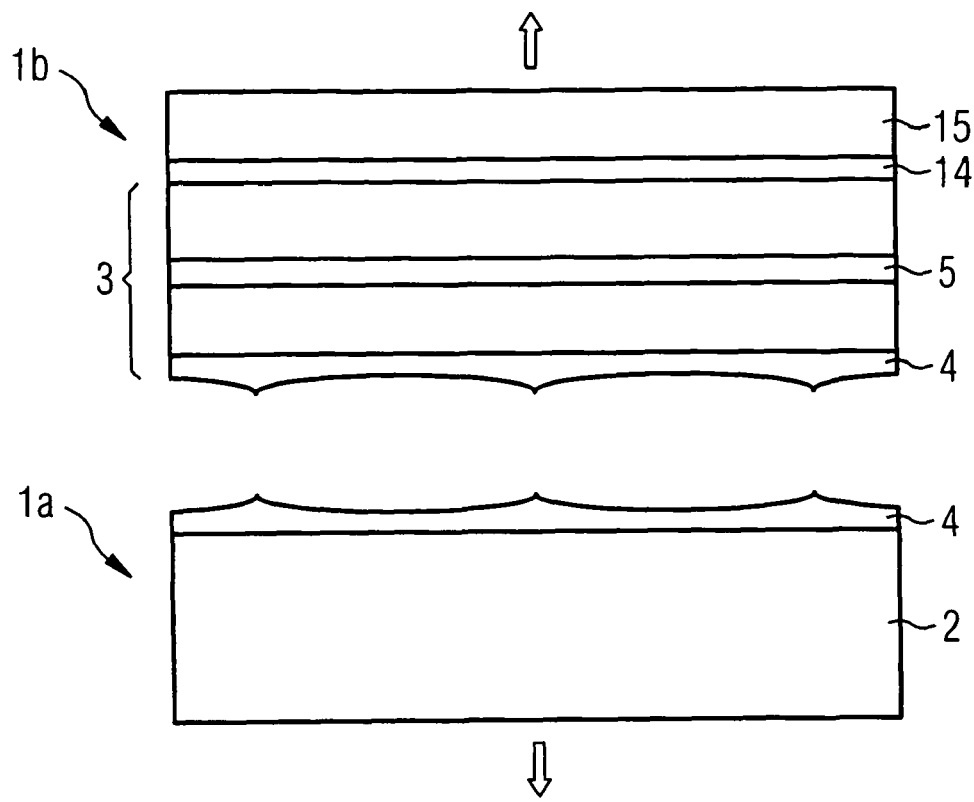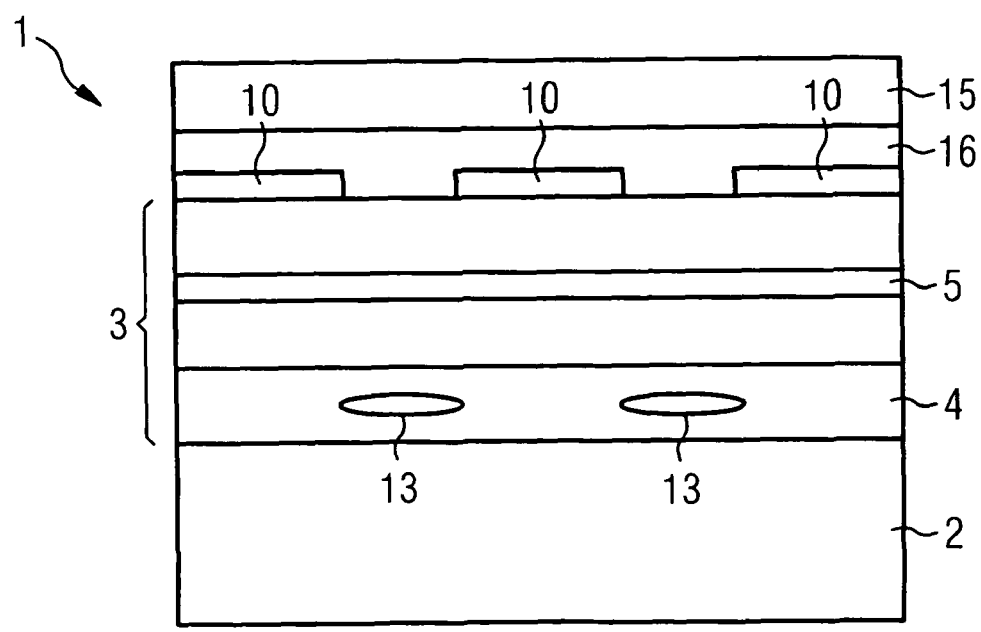

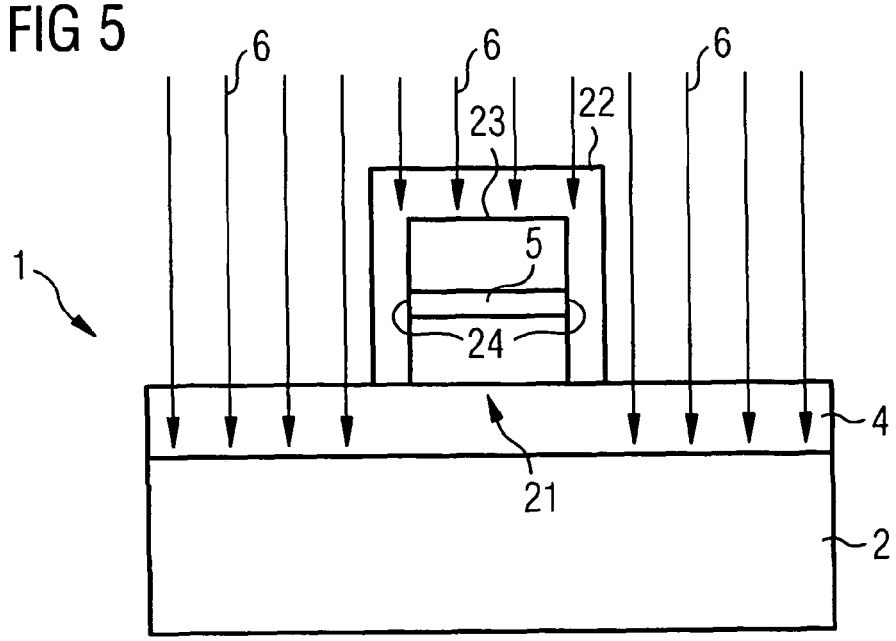
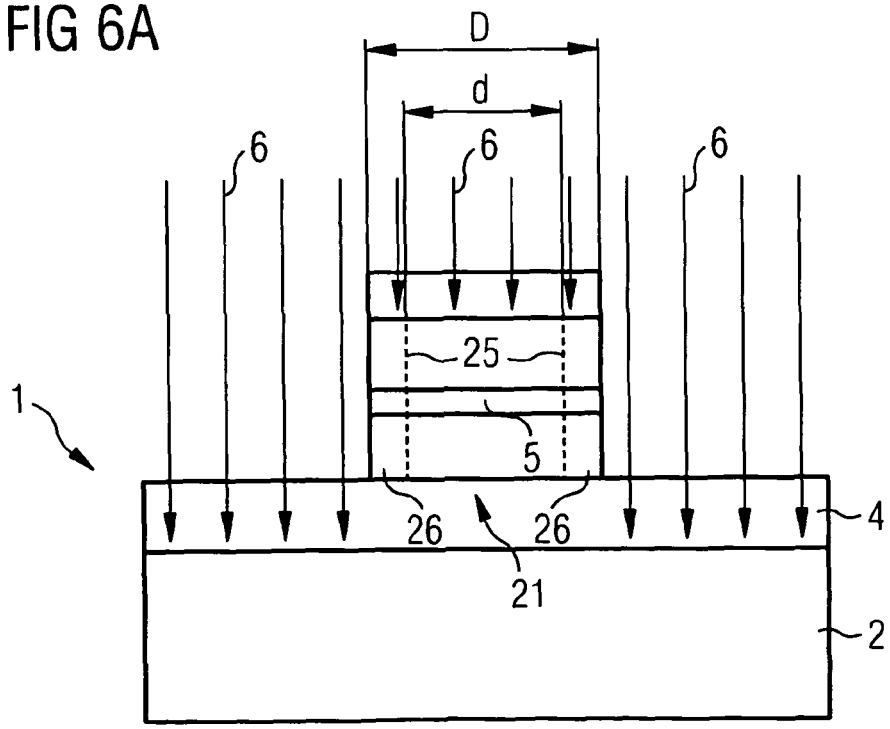

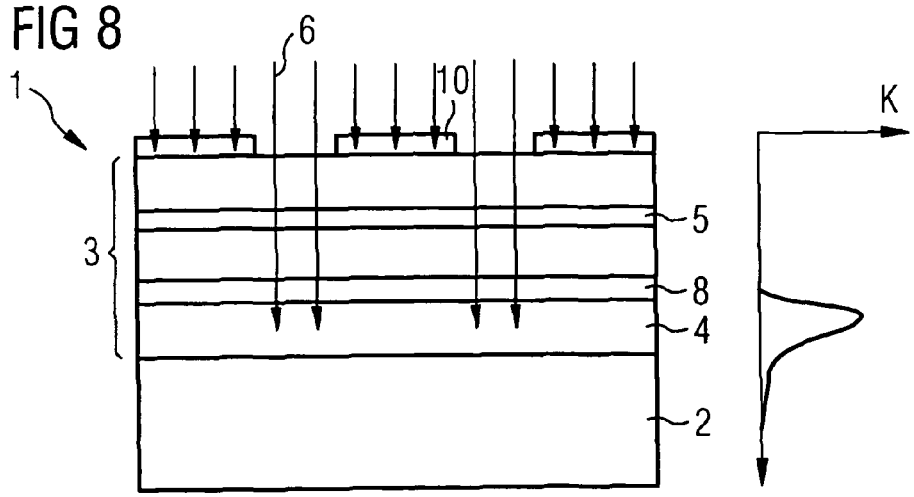
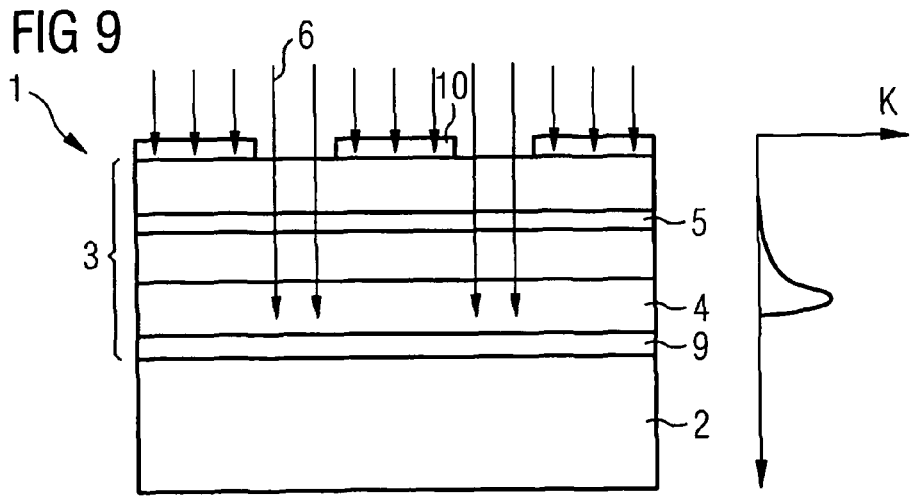
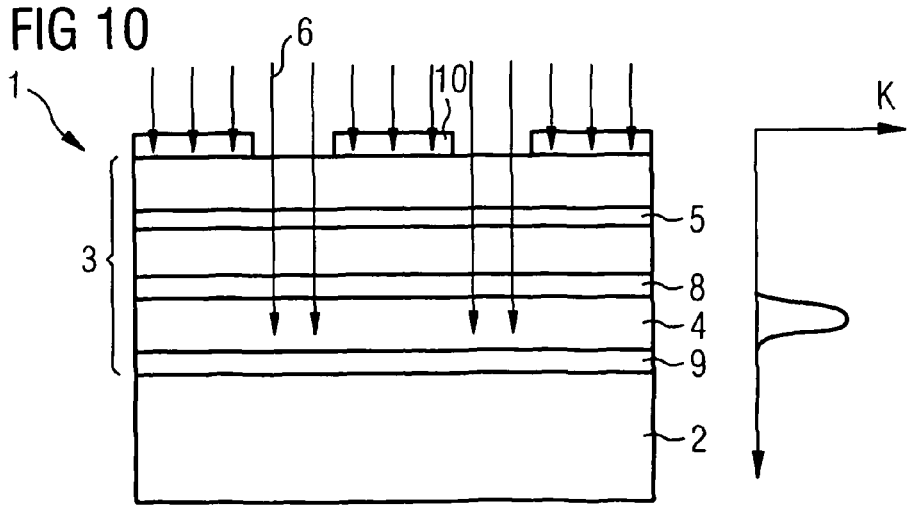

US 7,943,484 B2

METHOD FOR LATERALLY CUTTING THROUGH A SEMICONDUCTOR WAFER AND OPTOELECTRONIC COMPONENT

RELATED APPLICATIONS

This is a U.S. national stage of application No. PCT/DE2006/001377, filed on 7 Aug. 2006.

This patent application claims the priority of German patent applications 10 2005 052 357.9 filed Sept. 1, 2005 and 10 2005 041 572.5 filed Nov. 2, 2005, the disclosure content of both of which is hereby incorporated by reference.

FIELD OF THE INVENTION

The invention relates to a method for laterally dividing a semiconductor wafer, in particular a semiconductor wafer for producing optoelectronic components, and an optoelectronic component.

BACKGROUND OF THE INVENTION

In the production of optoelectronic components, for example LEDs or semiconductor lasers, it is often desirable for a growth substrate used for the epitaxial growth of a semiconductor layer sequence of the optoelectronic component to be subsequently separated from the semiconductor wafer.

By way of example, in so-called thin-film technology, firstly the semiconductor layer sequence of an optoelectronic component is grown epitaxially on a growth substrate, afterward a carrier is applied to the surface of the semiconductor layer sequence opposite to the growth substrate, and the growth substrate is subsequently separated. This method has the advantage, on the one hand, that a comparatively thin epitaxial layer sequence remains on the new carrier, from which layer sequence the radiation emitted by the optoelectronic component can be coupled out with high efficiency, particularly if a reflective or reflection-increasing layer is provided between the epitaxial layer sequence and the new carrier. Furthermore, the growth substrate can advantageously be reused after it has been stripped away. This is advantageous particularly when the growth substrate is composed of a comparatively high-priced material, in particular sapphire, SiC or GaN.

When a transparent growth substrate composed of sapphire is used, the growth substrate can be stripped away from the epitaxial layer sequence for example by means of a laser lift-off method known from WO 98/14986 (corresponding to U.S. Pat. No. 6,559,075). However, said method cannot readily be applied to substrates composed of a nitride compound semiconductor, in particular GaN.

The document U.S. Pat. No. 6,815,309 discloses transferring a thin layer of a high-priced substrate, for example GaN, to a lower-priced carrier substrate.

The document U.S. Pat. No. 5,374,564 discloses a method for separating a thin semiconductor layer from a substrate, which is based on the implantation of hydrogen ions through the layer to be stripped away and a subsequent thermal treatment for producing blisters in the ion-implanted region, which brings about a thermal ejection of the semiconductor layer to be stripped away.

When said method is applied to a semiconductor wafer onto which a functional semiconductor layer sequence has already been deposited epitaxially, there is the risk of the quality of the functional semiconductor layer sequence being impaired during the ion implantation.

The document C. H. Yun, N. W. Cheung: Thermal and Mechanical Separation of Silicon Layers from Hydrogen Pattern-Implanted Wafers, Journ. of Electronic Materials, vol. 30, No. 8, 2001, pp. 960-964, discloses a method for the thermal or mechanical separation of a silicon layer from a silicon wafer.

SUMMARY OF THE INVENTION

One object of the invention is to provide an improved method for laterally dividing a semiconductor wafer, and an optoelectronic component, in which the risk of damage to the semiconductor layer sequence during the ion implantation is reduced.

This and other objects are attained in accordance with one aspect of the present invention directed to a method for laterally dividing a semiconductor wafer according to the invention involves providing a growth substrate, onto which a semiconductor layer sequence is grown epitaxially, said semiconductor layer sequence comprising a functional semiconductor layer. Masked and unmasked regions are produced by applying a mask layer to partial regions of the semiconductor layer sequence. Ions are subsequently implanted into the semiconductor wafer through the unmasked regions in order to produce implantation regions. The growth substrate or at least one part of the growth substrate is then separated from the semiconductor wafer along the implantation regions.

Therefore, the ion implantation into the semiconductor wafer does not take place over the whole area, but advantageously only through those regions of the semiconductor layer sequence which are not covered by the mask layer. In this way, the partial regions of the semiconductor layer sequence which are covered by the mask layer, in particular the regions of the functional semiconductor layer which are arranged below the mask layer, are protected against possible damage during the ion implantation process.

Hydrogen ions are preferably implanted during the ion implantation. As an alternative, ions of noble gases such as, for example, helium, neon, krypton or xenon can also be used.

It is also possible for ions of different atoms to be implanted, in particular hydrogen ions and helium ions or hydrogen ions and boron ions. This has the advantage that the required implantation dose is reduced.

Dividing is preferably effected by means of a thermal treatment, preferably at a temperature within the range of 300° C. to 1200° C. In particular, the thermal treatment can be effected at a temperature of between 300° C. and 900° C. In this case, the ions implanted into the implantation regions diffuse and produce blisters. When the blisters converge, the semiconductor wafer is finally completely divided in the lateral direction and the growth substrate or at least one part of the growth substrate is separated from the semiconductor wafer in this way.

During the thermal treatment, the heating of the implantation regions can be brought about both by increasing the ambient temperature and by local heating by electromagnetic radiation, for example laser or microwave radiation.

The semiconductor wafer can be completely divided in the lateral direction along the implantation regions even though the ion implantation is effected only into partial regions of the semiconductor wafer on account of the masking of the semiconductor layer sequence. This is due to the fact that the ions diffuse in the lateral direction during the thermal treatment that follows the ion implantation, and in this way, proceeding from the implantation regions, also pervade the partial regions of the semiconductor wafer that are arranged below the mask layer with blisters.

As an alternative, the semiconductor wafer can also be divided mechanically along the implantation regions, for example by the opposite surfaces of the semiconductor wafer being connected to auxiliary carriers and a torque being exerted on the latter, such that the semiconductor wafer is divided along the implantation regions.

The semiconductor layer sequence is preferably based on a nitride compound semiconductor material. Hereinafter, "based on a nitride compound semiconductor material" means that a component or part of a component designated in this way preferably comprises $In_xAl_yGa_{1-x-y}N$, where $0 \leq x \leq 1$, $0 \leq y \leq 1$ and $x+y \leq 1$ hold true. In this case, said material need not necessarily have a mathematically exact composition according to the above formula. Rather, it can have one or more dopants and additional constituents which essentially do not change the physical properties of the material. For the sake of simplicity, however, the above formula only comprises the essential constituents of the crystal lattice (Al, Ga, In, N) even if these can be replaced in part by small quantities of further substances.

The functional semiconductor layer is preferably a radiation-emitting or radiation-detecting layer. In particular, the functional semiconductor layer can be the active layer of a luminescence diode or of a semiconductor laser. Particularly preferably, the functional semiconductor layer has $In_xAl_yGa_{1-x-y}N$ where $0 \leq x \leq 1$, $0 \leq y \leq 1$ and $x+y \leq 1$.

The growth substrate is preferably a substrate suitable for epitaxially growing a nitride compound semiconductor, in particular a GaN substrate, an AlN substrate, an SiC substrate or a sapphire substrate.

As an alternative, the semiconductor layer sequence can also be based on a phosphide compound semiconductor or an arsenide compound semiconductor. In this case, the semiconductor layer sequence, and in particular the functional semiconductor layer, preferably has $In_xAl_yGa_{1-x-y}P$ or $In_xAl_yGa_{1-x-y}As$ where $0 \leq x \leq 1$, $0 \leq y \leq 1$ and $x+y \leq 1$.

A mask layer can be composed for example of silicon, a metal, a dielectric such as, for example, SiN or $SiO_2$, or a resist. The mask layer has a thickness such that the implanted ions essentially cannot penetrate through it. By way of example, the mask layer can be a polycrystalline silicon layer having a thickness of 2 μm or more.

The masked regions of the semiconductor layer sequence preferably have a dimension of 20 μm or less, particularly preferably of 5 μm or less, in at least one lateral direction. Such a small lateral dimension of the masked regions is advantageous since the aim striven for is that the implanted ions diffuse during the thermal treatment from the implantation regions lying below the unmasked regions of the semiconductor layer into the adjoining regions in the lateral direction which lie below the masked regions of the semiconductor layer sequence, and therefore completely pervade the semiconductor wafer in the lateral direction with blisters. The mask layer can be a striped mask layer, for example, in which the stripes have a width of 5 μm or less, preferably between 1.5 μm and 3 μm inclusive.

The implantation regions are produced in the growth substrate, for example. In this case, the ions are implanted into the growth substrate through the unmasked regions of the semiconductor wafer.

In one preferred embodiment of the invention, the semiconductor layer sequence grown onto the growth substrate contains a layer which is provided as a separating layer and in which the implantation regions are produced. In this case, the ion implantation is not effected into the growth substrate, but rather into the separating layer. This has the advantage that a part of the semiconductor wafer which contains the entire growth substrate is separated when dividing the semiconductor wafer along the implantation regions produced in the separating layer. Therefore, the growth substrate is advantageously not severed when dividing the semiconductor wafer and can be completely reused. In particular, a layer sequence can repeatedly be grown on the growth substrate and be subsequently separated without the growth substrate being progressively consumed in the process. This is advantageous particularly when a high-priced substrate is used as growth substrate, such as, for example, a GaN substrate, an AlN substrate, a SiC substrate or a sapphire substrate.

After the method step of the thermal treatment for separating the growth substrate, the growth substrate can contain a separated part of the separating layer. This part of the separating layer which is contained on the growth substrate after separation is preferably subsequently removed from the growth substrate, for example by means of an etching or polishing process, in order to prepare the growth substrate for the epitaxial growth of further semiconductor layer sequences.

The separating layer preferably contains at least one element which has a higher atomic number than gallium, for example indium. The element having the higher atomic number than gallium can be introduced into the separating layer as a dopant or preferably be a constituent of the semiconductor material of the separating layer. In particular, the separating layer can be an InGaN layer. The presence of an element having a high atomic number in the separating layer has the advantage that the ions penetrating into the separating layer during the ion implantation are decelerated and, consequently, further penetration is reduced. In this case, therefore, the separating layer acts as a stop layer for the implanted ions.

This is advantageous particularly when comparatively high-energy ions are implanted during the ion implantation, in order to reduce possible damage to the functional semiconductor layer. In particular, it has been found that damage to the functional semiconductor layer can be reduced by increasing the ion energy during the ion implantation. However, increasing the ion energy generally has the consequence that the implanted ions form a wider and flatter concentration profile in a direction perpendicular to the plane of the separating layer, which might adversely affect the stripping process. The full width at half maximum of the concentration profile of the implanted ions may be for example approximately 200 nm.

By virtue of the fact that the separating layer contains at least one element having an atomic number greater than that of gallium, it is possible to obtain a comparatively narrow concentration profile in the separating layer even when the implanted ions have a comparatively high ion energy, whereby the separating method step is facilitated.

In a further advantageous configuration of the invention, the semiconductor layer sequence contains at least one diffusion barrier layer—adjacent to the separating layer—for the implanted ions. In this case, a diffusion barrier layer is understood to be a layer in which the implanted ions have a lower diffusion coefficient than in the separating layer. The diffusion barrier layer can be arranged above and/or below the separating layer in the growth direction of the semiconductor layer sequence.

The diffusion barrier layer advantageously contains a nitride compound semiconductor material doped with Zn, Fe or Si, and is preferably not p-doped. In particular, it has been found that hydrogen has a lower diffusion coefficient in comparatively high-impedance Zn-doped GaN or Si-doped n-GaN than in Mg-doped p-GaN.

Particularly preferably, a diffusion barrier layer is arranged on both sides of the separating layer, that is to say both above and below the separating layer in the growth direction of the semiconductor layer sequence. Diffusion of the implanted ions in a direction running perpendicular to the plane of the separating layer is reduced by the diffusion barrier layer or the diffusion barrier layers. An undesirable widening of the concentration profile of the implanted ions in a direction perpendicular to the layer plane of the separating layer is counteracted in this way. Diffusion of the implanted ions into the functional semiconductor layer can be reduced in particular by means of a diffusion barrier layer that is arranged above the separating layer as seen in the growth direction of the layer sequence. Otherwise, diffusion of the implanted ions could impair the quality of the functional semiconductor layer.

In a further preferred embodiment of the invention, the separating layer is a tensile-stressed layer. In this case, the lattice constant of the separating layer is lower than the lattice constant of at least one layer adjoining the separating layer. A consequence of this is that the separating layer is subjected to a tensile stress. Preferably, the tensile-stressed layer is a nitride compound semiconductor layer containing aluminum. In this case, the tensile stress of the separating layer can be brought about for example by the separating layer being adjoined by a further nitride compound semiconductor layer, which has a lower proportion of aluminum than the separating layer or is even free of aluminum. In particular, an InGaN layer can adjoin the separating layer. A tensile stress of the separating layer can furthermore be produced by doping the separating layer with silicon. The tensile stress of the separating layer advantageously facilitates the separating method step since the interface between the tensile-stressed separating layer and the adjoining layer having a higher lattice constant in this case acts as a desired breaking location.

Furthermore, in the case of the invention, the separating method step can advantageously be facilitated by the separating layer being a semiconductor layer produced by lateral epitaxial overgrowth (ELOG). In this case, the separating layer is not grown directly on the growth substrate or onto a semiconductor layer already applied to the growth substrate, rather a mask layer is applied beforehand to the growth substrate or the semiconductor layer on which the separating layer is intended to be grown. Said mask layer is referred to hereinafter as ELOG mask layer in order to differentiate it from the mask layer used for the ion implantation. The ELOG mask layer is preferably a silicon nitride layer or a silicon dioxide layer.

The epitaxial growth of the separating layer commences in the regions ("post" regions) of the growth substrate or of the semiconductor layer provided for the growth which are not covered by the ELOG mask layer, the masked regions ("wing" regions) subsequently being overgrown in the lateral direction. Since the adhesion of a separating layer produced by lateral epitaxial overgrowth on the laterally overgrown ELOG mask layer is only low, the interfaces between the mask layer and the separating layer act as desired breaking locations in the separating method step.

When the separating layer is embodied as an ELOG layer, the ion implantation is preferably effected into the regions of the separating layer which are arranged offset from the ELOG mask layer in the lateral direction ("post" regions). For this purpose, the mask layer used for the ion implantation and ELOG mask layer advantageously have the same patterning. This should be understood such that, seen in the vertical direction, the regions of the semiconductor layer which are masked by the mask layer lie opposite the regions of the growth substrate which are masked by the ELOG mask layer and are preferably congruent. An ion implantation into the regions of the separating layer which are arranged above the ELOG mask layer ("wing" regions) can advantageously be dispensed with since the separating layer can be severed comparatively simply in said regions on account of the low adhesion of the separating layer on the ELOG mask layer.

Furthermore, it is advantageous if the separating layer is formed from a semiconductor material in which the implanted ions have a greater diffusion coefficient than in a layer adjoining the separating layer. This increases the diffusion of the implanted ions within the separating layer, that is to say in particular in a direction running parallel to the plane of the semiconductor wafer, and therefore provides the formation of blisters in the separating layer, whereby the separating method step is facilitated. The diffusion-promoting separating layer is preferably a p-doped nitride compound semiconductor layer, which can be doped with Mg, for example. In particular, it has been found that hydrogen has a higher diffusion coefficient in p-doped GaN than in a Zn-doped high-impedance GaN layer or a silicon-doped n-GaN layer.

The semiconductor wafer is preferably connected to a carrier substrate prior to dividing at a surface remote from the growth substrate. The carrier substrate stabilizes the semiconductor layer sequence after separation from the growth substrate and can function in particular as a carrier for an optoelectronic component produced from the semiconductor layer sequence.

The carrier substrate can be an intermediate carrier, provision being made for separating or detaching the intermediate carrier in a subsequent method step. By way of example, the intermediate carrier is a glass substrate. The glass substrate is preferably connected to the semiconductor layer sequence by means of an interlayer composed of a silicon oxide. In this case, in a later method step, the intermediate carrier including the interlayer can be dissolved for example in hydrofluoric acid (HF).

The mask layer used during the ion implantation can be removed for example prior to connecting the semiconductor layer sequence to the carrier substrate. As an alternative, the mask layer can also remain on the semiconductor layer sequence, an interlayer preferably being applied prior to connecting the semiconductor layer sequence to the carrier substrate, said interlayer planarizing the mask layer. The planarizing interlayer has the advantage that the force due to the weight of the carrier substrate also acts on the unmasked regions of the semiconductor layer sequence, which would otherwise be spaced apart from the carrier substrate by the mask layer. The effect of the force due to the weight of the carrier substrate on the implantation regions has the advantage during the thermal treatment method step that a propagation of the blisters produced by the diffusion of the ions is promoted in the lateral direction and is reduced in a vertical direction running perpendicular to the growth direction of the semiconductor layer sequence.

In the case of a mask layer composed of a metal or a metal alloy, this can remain as an electrical contact layer on the semiconductor layer sequence. In this case, the electrical contact layer, without further production outlay, is applied in patterned fashion to those regions of the semiconductor layer sequence into which no ions are implanted. If appropriate, a contact metal suitable for forming an electrical contact with the topmost layer of the semiconductor layer sequence can be introduced into the mask layer. Advantageously, during the thermal treatment for producing the blisters, at the same time a contact metal is introduced into the mask layer by forming an alloy with the metal of the mask layer.

In a particularly preferred embodiment, prior to connecting the semiconductor wafer to the carrier substrate, an interlayer is applied to the unmasked regions of the semiconductor wafer, the thickness of said interlayer being greater than the thickness of the mask layer. In this case, the masked regions of the semiconductor layer sequence are spaced apart from the carrier substrate by the interlayer applied to the unmasked regions. Therefore, the force due to the weight of the carrier substrate advantageously acts primarily on the unmasked regions, whereby the propagation of the blisters produced by the diffusion of the implanted ions is intensified in the lateral direction and inhibited in the vertical direction. The propagation of the blisters produced into those regions of the semiconductor wafer which are arranged below the mask layer is promoted in this way. This effect can alternatively also be obtained by removing the mask layer and applying an interlayer to the semiconductor layer sequence, which is patterned in such a way that it essentially covers the regions of the semiconductor layer sequence into which the ions were implanted. The effect of the force due to the weight of the carrier substrate on the implantation regions can be intensified by exerting a force directed toward the growth substrate on the carrier substrate.

In a further preferred embodiment, the semiconductor layer sequence is patterned prior to the ion implantation. By way of example, the semiconductor layer sequence can be patterned in such a way that it has a structure suitable for producing luminescence diodes or semiconductor laser components.

In particular, the semiconductor layer sequence can be patterned in such a way that the semiconductor wafer comprises one or preferably a plurality of stripe laser structures, which are singulated into individual stripe laser components in a subsequent process step. The stripe lasers preferably have a stripe width of approximately 1.5 µm to approximately 3 µm. Such a width of the structures is advantageously small enough that the implanted ions, during the thermal treatment, diffuse far enough in the lateral direction that a complete stripping away of these structures is brought about as a result of the blister formation.

If the patterning of the semiconductor layer sequence is already effected prior to the ion implantation, it is advantageous if the structure produced, in particular the side flanks of the structure, are protected against the ions by means of an enveloping mask layer. An enveloping mask layer should be understood to mean a mask layer which covers both the surface and the side flanks of the structure.

The method according to the invention is suitable in particular for producing optoelectronic components, for example for producing luminescence diodes or laser diodes.

An optoelectronic component according to an embodiment of the invention contains a semiconductor layer sequence which is arranged on a carrier substrate and which has a functional semiconductor layer, wherein the semiconductor layer sequence was separated from a growth substrate by the above-described method for laterally dividing a semiconductor wafer. In particular, the optoelectronic component can be a luminescence diode (LED) or a laser diode.

BRIEF DESCRIPTION OF THE DRAWINGS

FIGS. 1A, 1B, 1C, 1D, 1E, 1F and 1G show schematic illustrations of a cross section through a semiconductor wafer during intermediate steps of an exemplary embodiment of a method according to the invention, FIG. 2 shows a schematic illustration of a cross section through a semiconductor wafer prior to the method step of dividing the semiconductor wafer in a further exemplary embodiment of a method according to the invention, FIG. 5 shows a schematic illustration of a cross section through a semiconductor wafer during the method step of ion implantation in a further exemplary embodiment of a method according to the invention, FIG. 6A shows a schematic illustration of a cross section through a semiconductor wafer during the method step of ion implantation in a further exemplary embodiment of a method according to the invention, FIG. 8 shows a schematic illustration of a cross section through a semiconductor wafer during the method step of ion implantation in a further exemplary embodiment of a method according to the invention, FIG. 9 shows a schematic illustration of a cross section through a semiconductor wafer during the method step of ion implantation in a further exemplary embodiment of a method according to the invention, FIG. 10 shows a schematic illustration of a cross section through a semiconductor wafer during the method step of ion implantation in a further exemplary embodiment of a method according to the invention.

DETAILED DESCRIPTION OF THE DRAWINGS

Identical or identically acting elements are provided with the same reference symbols in the figures. The elements illustrated should not be regarded as true to scale, rather individual elements may be illustrated with an exaggerated size in order to afford a better understanding.

Figure 1A:
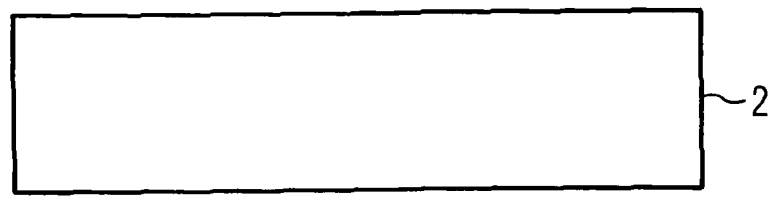

As illustrated in FIG. 1A, a method according to the invention involves providing the growth substrate 2. The growth substrate 2 is a substrate suitable for epitaxially growing a nitride compound semiconductor, said substrate preferably being a GaN substrate, an AlN substrate or alternatively a SiC substrate or a sapphire substrate.

Figure 1B:
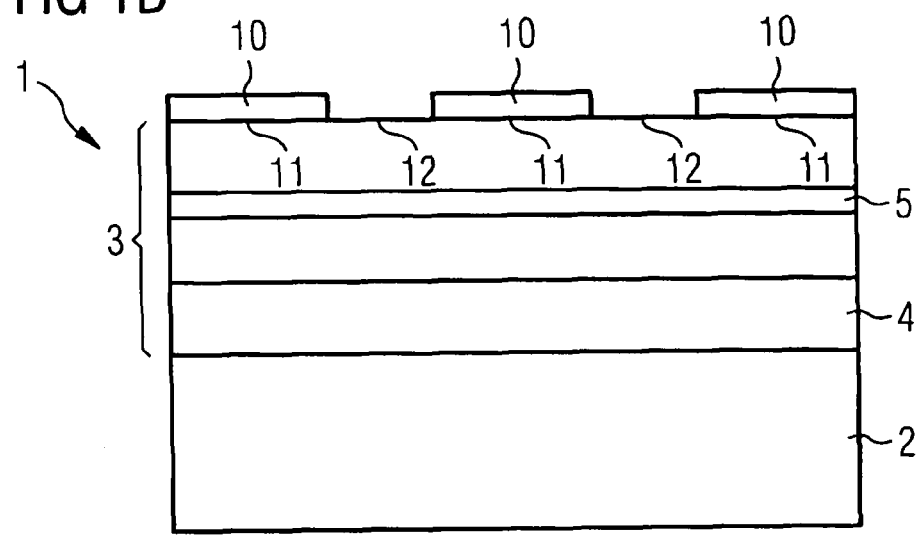

In the intermediate step illustrated schematically in FIG. 1B, a semiconductor layer sequence 3 is grown epitaxially onto the growth substrate 2. The semiconductor wafer 1 produced in this way contains the growth substrate 2 and the semiconductor layer sequence 3. The semiconductor layer sequence 3 is applied to the growth substrate 2 for example by means of metal organic vapor phase epitaxy (MOVPE).

The epitaxial semiconductor layer sequence 3 is preferably based on a nitride compound semiconductor. The epitaxial semiconductor layer sequence 3 contains at least one functional semiconductor layer 5, for example a radiation-emitting or radiation-detecting layer provided for an optoelectronic component.

In particular, the functional semiconductor layer 5 can be an active layer of a luminescence diode or of a semiconductor laser. In this case, the active layer can be formed for example as a heterostructure, double heterostructure or as a quantum well structure. In this case, the designation quantum well structure encompasses any structure in which charge carriers experience a quantization of their energy states by means of confinement. In particular, the designation quantum well structure does not comprise any indication about the dimensionality of the quantization. It therefore encompasses, inter alia, quantum wells, quantum wires and quantum dots and any combination of these structures.

Furthermore, in the intermediate step illustrated in FIG. 1B, a patterned mask layer 10 is applied to the semiconductor layer sequence 3. The surface of the semiconductor layer sequence 3 therefore has masked regions 11 covered by the mask layer 10, and unmasked regions 12. It is advantageous if the width b of the masked regions 11 in at least one lateral direction is 20 µm or less, particularly preferably 5 µm or less.

Figure 1C:
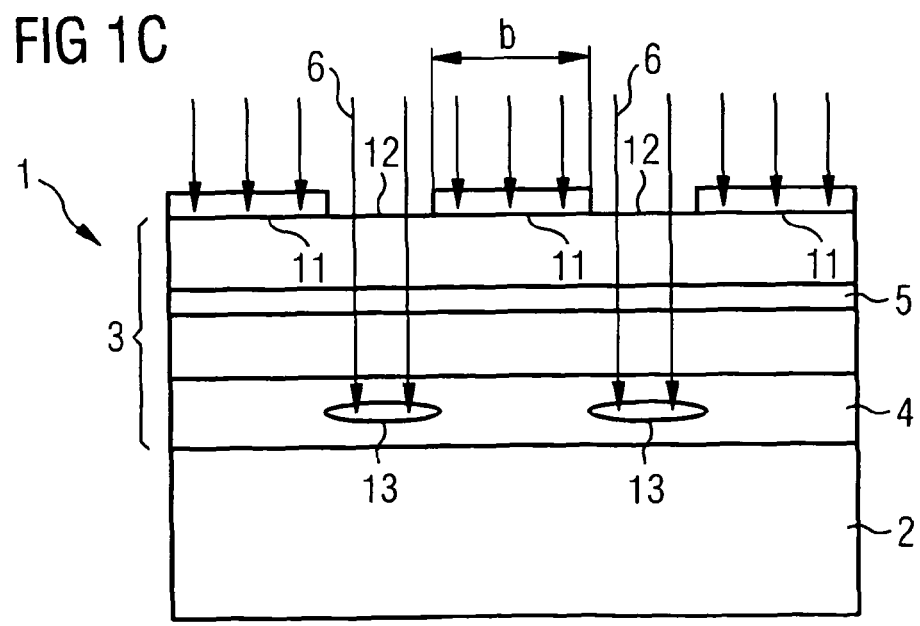

In the intermediate step illustrated schematically in FIG. 1C, ions are implanted into the semiconductor wafer 1, as indicated by the arrows 6, through the unmasked regions 12 through the semiconductor layer sequence 3 in order to produce implantation regions 13.

By contrast, the ions advantageously cannot penetrate into the masked regions 11 of the semiconductor layer sequence 3 since they essentially cannot penetrate through the material of the mask layer 10. In particular, this prevents the partial regions of the functional semiconductor layer 5 which are arranged below the masked regions 11 from being damaged during the method step of ion implantation.

The mask layer 10 can be formed for example from a metal, a dielectric or a resist, the thickness being chosen in a manner dependant on the ion energy of the implanted ions in such a way that the mask layer 10 essentially cannot be penetrated by the ions. By way of example, the mask layer 10 can be a silicon oxide layer having a thickness of approximately 2 µm.

The implanted ions can be in particular hydrogen ions, or alternatively ions of noble gases such as, for example, helium, neon, krypton or xenon.

It is also possible for ions of different atoms to be implanted, in particular hydrogen ions and helium ions or hydrogen ions and boron ions. This has the advantage that the required implantation dose is reduced.

The implantation regions 13 are preferably produced in a layer 4 which is provided as a separating layer and which is contained in the semiconductor layer sequence 3. As an alternative, it is also possible to implant the ions for forming the implantation regions 13 into the growth substrate 2.

Figure 1D:
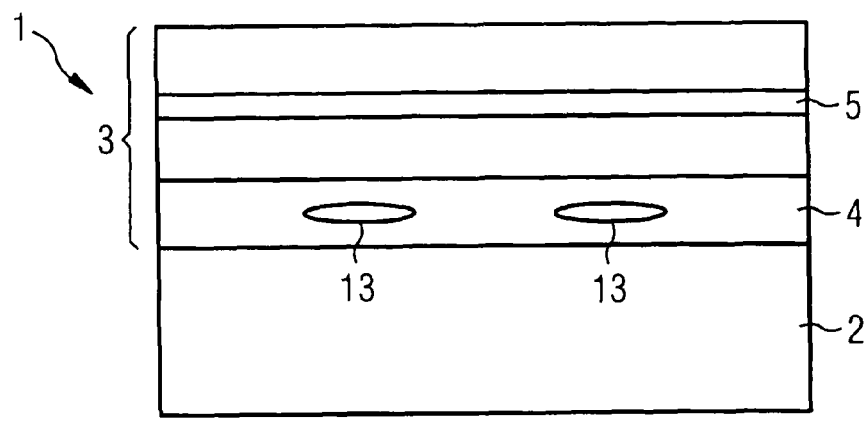

The mask layer 10 can thereupon be removed again from the semiconductor layer sequence 3, as illustrated in FIG. 1D.

Figure 1E:
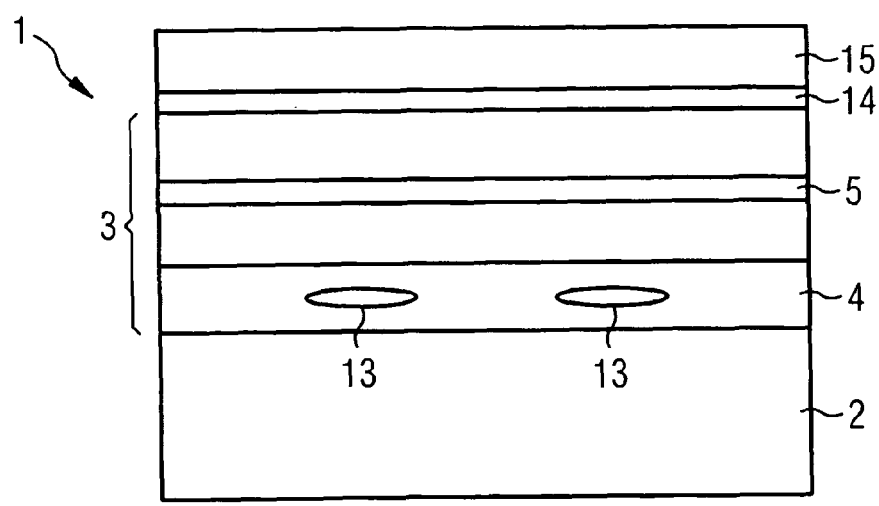

Afterward, as illustrated in FIG. 1E, the semiconductor wafer 1 is connected to a carrier substrate 15 at a side remote from the growth substrate 2. Since, in contrast to the growth substrate 2, the carrier substrate 15 does not have to be suitable for epitaxially growing the semiconductor layer sequence 3, which is based for example on a nitride compound semiconductor material, there is a comparatively high freedom in the material selection for the carrier substrate 15. In particular, a carrier substrate 15 can be selected which is distinguished by comparatively low costs and/or a good thermal conductivity. By way of example, the carrier substrate 15 can be formed from Ge, GaAs, metals such as, for example, Mo or Au, metal alloys or ceramics such as, for example AlN.

The carrier substrate 15 is preferably connected to the semiconductor layer sequence 3 by means of soldering or bonding.

Prior to connecting the semiconductor wafer 1 to the carrier substrate 15, an interlayer 14 can be applied to the semiconductor layer sequence 3. The interlayer 14 can be applied for example for the purpose of smoothing the semiconductor layer sequence 3 after the method step of ion implantation and the removal of the mask layer. Furthermore, the interlayer 14 can also be a reflective layer that is intended to prevent radiation from penetrating into the carrier substrate 15 in an optoelectronic component.

Figure 1F:
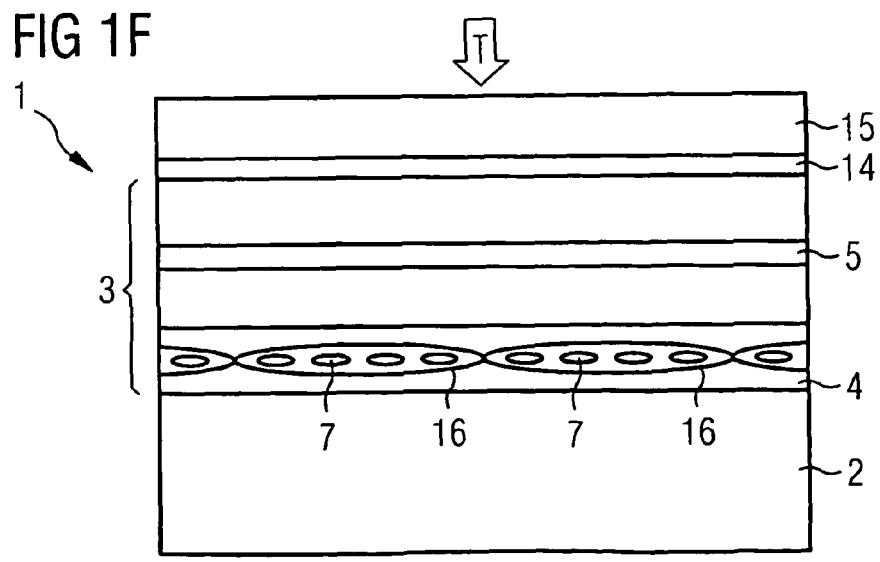

Afterward, as indicated by the arrow T in FIG. 1F, a thermal treatment is carried out, which brings about diffusion of the ions implanted into the implantation regions 13.

The thermal treatment is preferably effected at a temperature of between 300° C. and 1200° C. The diffusion of the implanted ions which is excited by the thermal treatment leads to a formation of blisters 7, the size and number of which increase as the duration of the thermal treatment increases.

This gives rise to diffusion regions 16 pervaded by blisters 7, said diffusion regions extending in the lateral direction also below the previously masked regions of the semiconductor layer sequence 3 and finally converging there.

The converging of the diffusion regions 16 pervaded by blisters 7 finally leads, as is illustrated schematically in FIG. 1G, to the semiconductor wafer being divided into two parts 1a, 1b.

The part 1b of the semiconductor wafer 1 which is separated from the growth substrate 2 can be in particular an optoelectronic component, for example a luminescence diode or a semiconductor laser, or be processed further to form an optoelectronic component. Furthermore, the separated part 1b of the semiconductor wafer can also be singulated to form a plurality of optoelectronic components.

By virtue of the fact that the ions were not implanted into the growth substrate 2, but rather into a layer of the semiconductor layer sequence 3 which is provided as a separating layer 4, a part 1a of the semiconductor wafer 1 which contains the entire growth substrate 2 is advantageously separated when the semiconductor wafer 1 is divided. After dividing, as is illustrated schematically in FIG. 1G, the separated part 1a of the semiconductor wafer contains residues of the separating layer 4, which can be removed in a subsequent etching or polishing process. The growth substrate 2 is therefore completely reusable. Furthermore, the semiconductor layer sequence 3 connected to the carrier substrate 15 may also have residues of the separating layer 4, which are advantageously removed in a subsequent etching or polishing process.

FIG. 2 illustrates a semiconductor wafer after the method step of ion implantation into the implantation regions 13 in a further exemplary embodiment, wherein, unlike in the exemplary embodiment described above, the mask layer 10 was not removed from the surface of the semiconductor layer sequence 3, but rather was provided with a planarizing interlayer 16 prior to connecting the semiconductor wafer 1 to the carrier substrate 15. The mask layer 10 is leveled by the interlayer 16 and is advantageously not removed prior to connecting the semiconductor wafer 1 to the carrier substrate 15. The production outlay is reduced in this way.

During the subsequent method step of thermal treatment, the carrier substrate 15 connected to the planarizing interlayer 16 exerts a force on the implantation regions 13 which promotes the lateral propagation of the blisters and reduces the vertical propagation.

Figure 3:
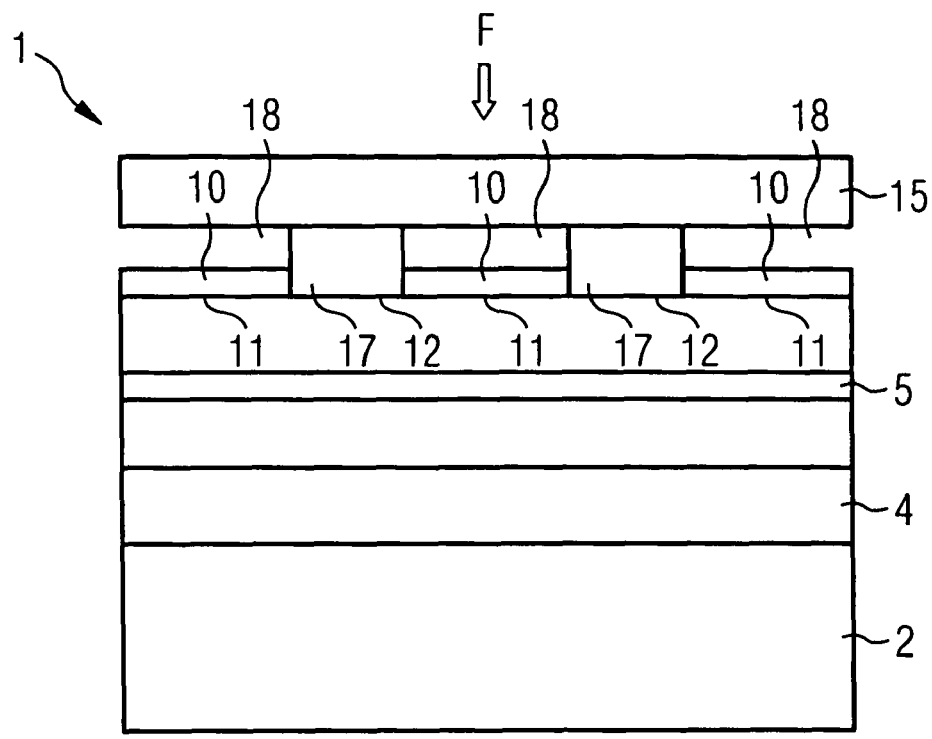
FIG. 3 shows a schematic illustration of a cross section through a semiconductor wafer prior to the method step of dividing the semiconductor wafer in a further exemplary embodiment of a method according to the invention.

This advantageous influence of the carrier substrate 15 on the propagation of the blisters produced during the thermal treatment can be intensified further if, as illustrated in FIG. 3 on the basis of a further exemplary embodiment, the semiconductor wafer 1 is connected to the carrier substrate 15 via an interlayer 17 having a larger thickness than the mask layer 10. In this case, the semiconductor wafer 1 is connected to the carrier substrate 15 via the interlayer 17 only in the unmasked regions 12, whereas the masked regions 11 are spaced apart from the carrier substrate 15 by interspaces 18. In order to further increase the influence of the carrier substrate 15 on the diffusion of the ions implanted into the implantation regions 13, a force F is advantageously exerted on the carrier substrate 15 in the direction toward the semiconductor wafer 1 during the method step of thermal treatment.

Figure 4:
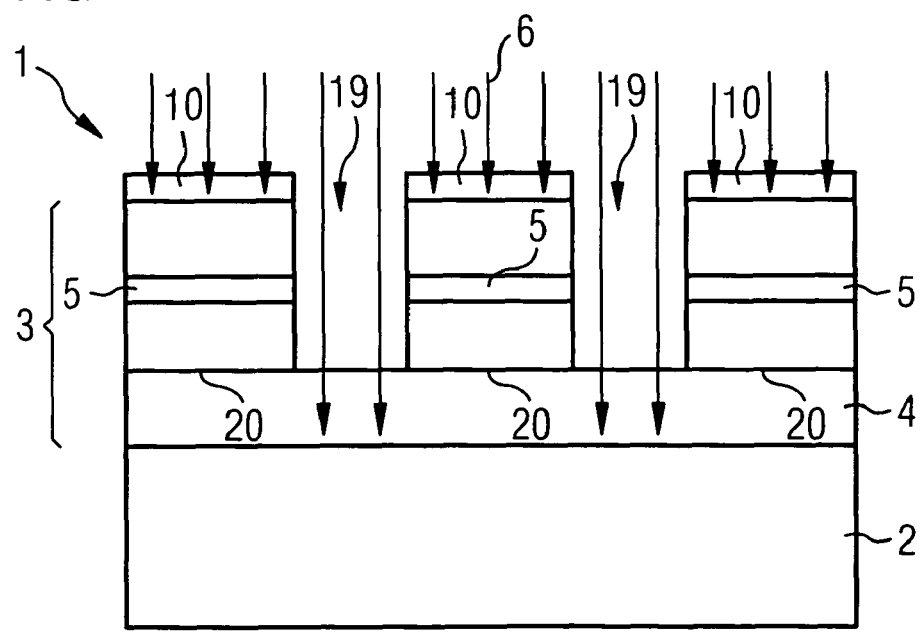
FIG. 4 shows a schematic illustration of a cross section through a semiconductor wafer during the method step of ion implantation in a further exemplary embodiment of a method according to the invention.

FIG. 4 schematically illustrates a semiconductor wafer 1 during the method step of ion implantation in a further exemplary embodiment of the invention, in which the semiconductor layer sequence 3 was patterned prior to the ion implantation. The semiconductor layer sequence 3 can be patterned for example in such a way that it has trenches 19 in which the separating layer 4 is uncovered, for example by means of an etching process. Through the trenches 19 produced in the semiconductor layer sequence 3, the ions can be implanted directly into the separating layer 4 during the ion implantation without traversing the remaining layers of the semiconductor layer sequence 3, in particular the functional semiconductor layer 5, in the process. This has the advantage, in particular, that only a comparatively low ion energy and/or ion dose is required during the ion implantation. The partial regions 20 of the semiconductor layer sequence 3 which are arranged between the trenches 19 can for example be singulated into individual optoelectronic components, for example to form stripe lasers, in a later method step. Furthermore, it is also possible for a plurality of the partial regions 20 which are separated by trenches 19 to jointly form the semiconductor chip of an optoelectronic component, for example of a luminescence diode.

In the method step of ion implantation illustrated in FIG. 5 in one exemplary embodiment of the method according to the invention, a semiconductor layer sequence was patterned to form a stripe laser 21 prior to the ion implantation. The stripe laser 21 is advantageously surrounded by an enveloping mask layer 22, which covers not only the surface 23 but also the side flanks 24 of the stripe laser 21. This has the advantage that the side flanks 24 are protected, during the ion implantation, against possibly impinging high-energy ions. In particular, this prevents damage to the active zone 5 of the stripe laser 21. Furthermore, it is advantageous that the regions of the separating layer 4 which adjoin the stripe laser 21 are covered by the mask layer 22 in order to reduce a non-radiative recombination of the charge carriers in the ion-implanted regions during operation of the stripe laser. By way of example, in the case of a stripe laser 21 having a width of 1.5 µm, the mask layer 22 can have a width of 5.5 µm, such that a 2 µm wide striped region of the surface of the separating layer 4 is in each case masked on both sides of the striped laser 21.

Figure 6B:
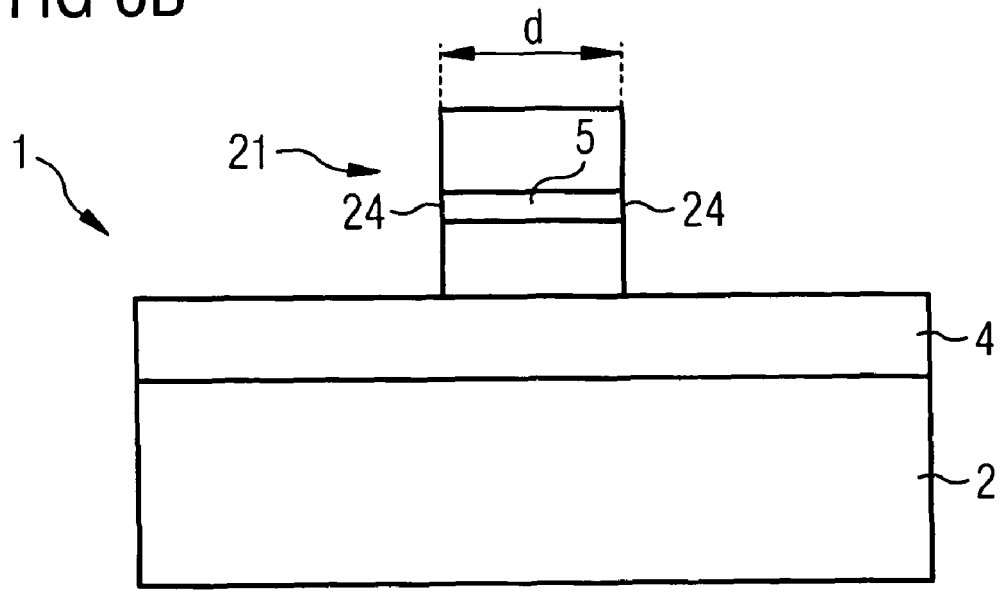
FIG. 6B shows a schematic illustration of a cross section through the semiconductor wafer illustrated in FIG. 6A after the patterning of the semiconductor layer sequence to form a laser stripe.

A further preferred embodiment of the method, in which possible damage to the side flanks 24 of an optoelectronic component, in particular of a stripe laser 21, during the method step of ion implantation is avoided, is illustrated schematically in FIGS. 6A and 6B.

A semiconductor layer sequence is applied to the semiconductor wafer 1 illustrated in FIG. 6A, said semiconductor layer sequence being patterned in such a way that it has a width D greater than a width d provided for the stripe laser 21 illustrated in FIG. 6B. The partial regions 26 of the semiconductor layer sequence which are arranged outside the dashed lines 25 illustrated in FIG. 6A are only removed after the method step of ion implantation, by means of a further patterning step, in order to produce the stripe laser 21 illustrated in FIG. 6B. In this way, the side flanks 24 of the stripe laser 21 are protected against possible damage during the preceding method step of ion implantation.

Figure 7:
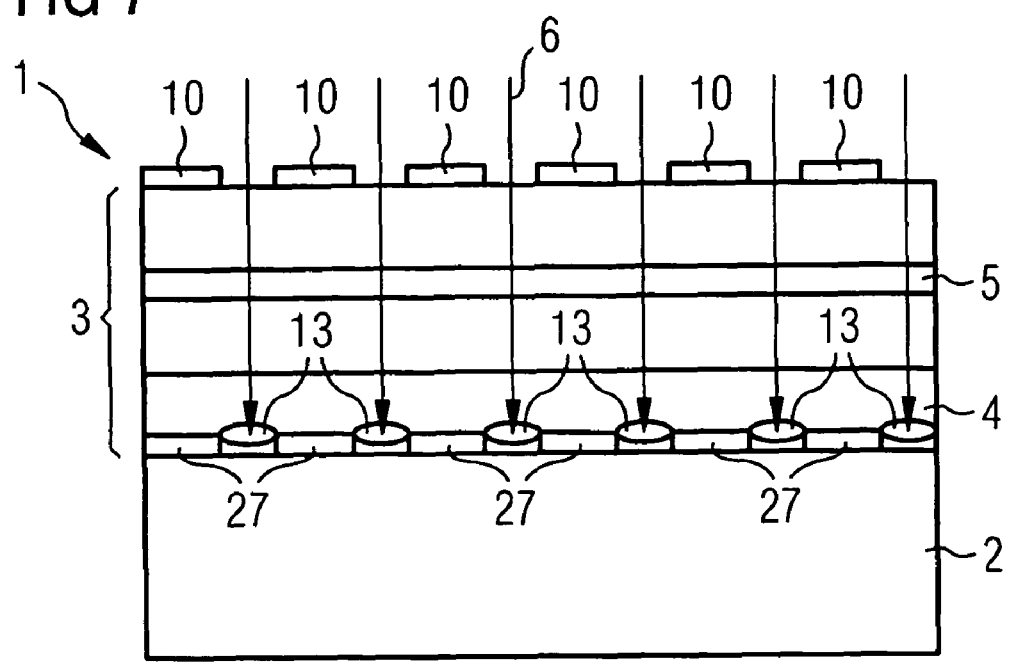
FIG. 7 shows a schematic illustration of a cross section through a semiconductor wafer during the method step of ion implantation in a further exemplary embodiment of a method according to the invention.

In the intermediate step of ion implantation illustrated schematically in FIG. 7 in a further exemplary embodiment of the method according to the invention, the separating layer 4 is a layer produced by epitaxial lateral overgrowth (ELOG). In order to produce the ELOG layer, a mask layer 27 is applied to the growth substrate 2 in patterned fashion. As an alternative, if the separating layer 4 is not applied directly to the growth substrate 2, the mask layer 27 could be applied to a semiconductor layer arranged below the separating layer 4 in the growth direction.

The ELOG mask layer 27 can be, in particular, a silicon nitride or silicon oxide layer.

Instead of an ELOG mask layer 27, it is also possible to use an in-situ SiN layer for growing the separating layer by means of lateral overgrowth. An in-situ SiN layer is applied as such a thin layer that it has not yet grown together to form a continuous layer and therefore does not completely cover the growth substrate. In this way, the in-situ SiN layer functions as a mask layer.

The separating layer 4 produced by means of lateral epitaxial overgrowth simplifies dividing the semiconductor wafer 1 since the semiconductor material of the separating layer 4 has comparatively low adhesion on the regions of the mask layer 27 which are laterally overgrown. Therefore, the semiconductor wafer 1 can be divided with comparatively low outlay in a plane running along a surface of the mask layer 27 which faces the separating layer 4.

The structure of the ELOG mask layer 27 and the structure of the mask layer 10 used for the ion implantation particularly preferably correspond. In this case, the ions are advantageously implanted into implantation regions 13 of the separating layer 4 which are arranged between the regions of the ELOG mask layer 27 which are laterally overgrown by the separating layer 4.

In a further preferred exemplary embodiment, as illustrated schematically in FIG. 8, a diffusion barrier layer 8 is arranged above the separating layer 4 in the growth direction of the semiconductor layer sequence 3.

The diffusion barrier layer 8 is preferably a high-impedance or n-doped nitride compound semiconductor layer, for example a Zn-doped GaN layer or an Si-doped n-GaN layer. In particular, the diffusion barrier layer 8 is not p-doped.

The diffusion barrier layer 8 advantageously reduces diffusion of the ions implanted into the separating layer 4 into overlying semiconductor layers, in particular into the functional semiconductor layer 5. The schematically illustrated depth profile of the concentration K of the implanted ions is narrowed toward the top in this way. Damage to the functional semiconductor layer by diffusing ions is prevented in this way.

In the exemplary embodiment illustrated in FIG. 9, in contrast to the exemplary embodiment illustrated in FIG. 8, a diffusion barrier layer 9 is arranged below rather than above the separating layer 4. By virtue of the diffusion barrier layer 9 arranged below the separating layer 4 in the growth direction, advantageously diffusion of the implanted ions into the growth substrate 2 is reduced and the schematically illustrated depth profile of the concentration K of the implanted ions is narrowed toward the growth substrate 2.

Particularly preferably, as illustrated in FIG. 10 on the basis of a further exemplary embodiment, diffusion barrier layers 8, 9 are arranged both below and above the separating layer 4. In this case, the concentration profile K of the implanted ions is advantageously narrowed on both sides of the separating layer 4 by a reduction of the diffusion of the ions into the adjoining layers and the growth substrate 2.

It goes without saying that the arrangement of diffusion barrier layers 8, 9 above and/or below the separating layer 4 as explained with reference to FIGS. 8 to 10 can be combined with the above-described advantageous configurations of the separating layer 4.

Figure 11:
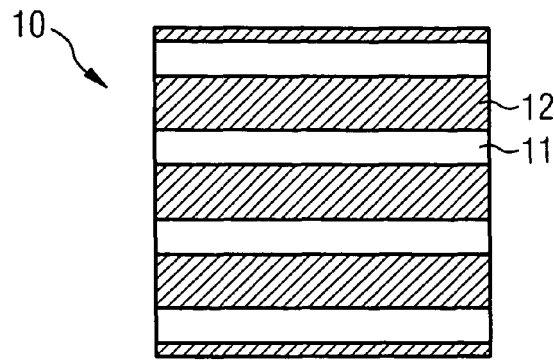
FIGS. 11, 12A, 12B, 13A, and 13B show schematic illustrations of a plan view of the mask layer in further exemplary embodiments of a method according to the invention.

FIGS. 11, 12 and 13 show different embodiments of the mask layer 10 in exemplary embodiments of the method according to the invention on the basis of schematically illustrated plan views of the semiconductor wafer after the method step of applying the mask layer. In this case, the unmasked regions 12 are respectively illustrated in hatched fashion in contrast to the masked regions 11.

The exemplary embodiment illustrated in FIG. 11 shows a striped mask layer 10, which can be used in particular in an application of the method according to the invention for producing optoelectronic components, such as stripe lasers, in particular. The width of the stripes is preferably 5 µm or less.

Figure 12A:
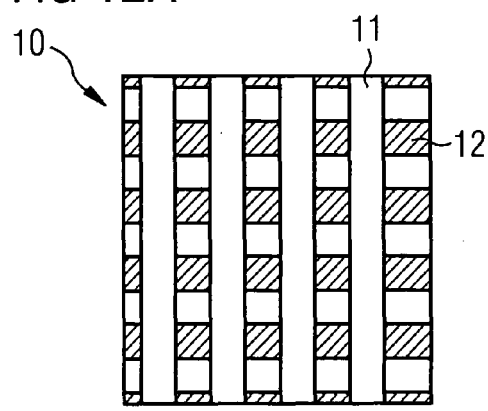
Figure 12B:
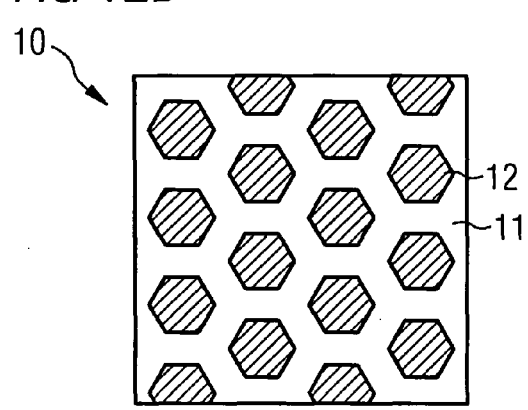

As an alternative, the mask layer 10 can also have a lattice structure, as illustrated for example in FIGS. 12A and 12B. The lattice structure can be for example a stripe lattice illustrated in FIG. 12A. As an alternative, any other lattice structures are also conceivable, such as the lattice structure illustrated in FIG. 12B, for example, which contains hexagonal structures.

Figure 13A:
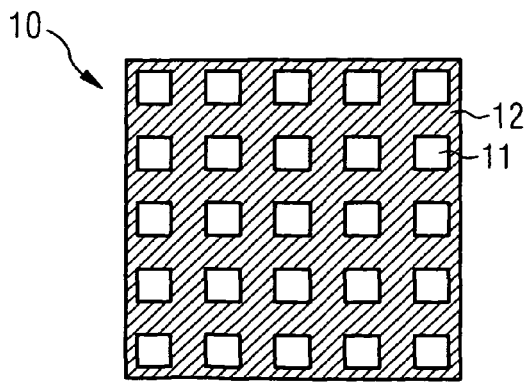
Figure 13B:
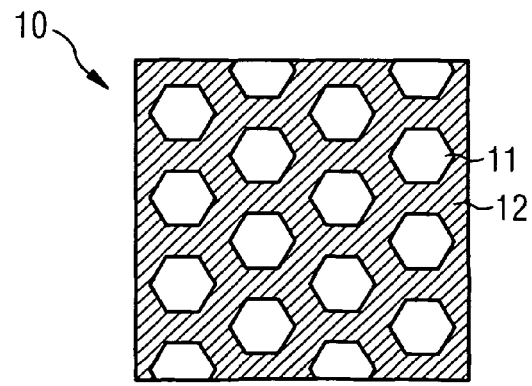

Point-type mask layers 10 can likewise be used, as illustrated schematically in FIGS. 13A and 13B. In this case, the individual points 11 of the mask layer can have any geometrical forms, for example a square form as illustrated in FIG. 13A or a hexagonal structure as illustrated in FIG. 13B. As an alternative, the points of the mask layer 10' can have for example round or triangular forms. The lateral dimensions of the mask points 11, for example the edge lengths in the case of a square or rectangular form of the mask points 11, are preferably 5 µm or less.

The lattice-type or point-type mask layers illustrated in FIGS. 12 and 13 can be used in particular in an application of the method according to the invention when producing luminescence diodes.

The invention is not restricted by the description on the basis of the exemplary embodiments. Rather, the invention encompasses any new feature and also any combination of features, which in particular comprises any combination of features in the patent claims, even if this feature or this combination itself is not explicitly specified in the patent claims or exemplary embodiments.

The invention claimed is:

1. A method for laterally dividing a semiconductor wafer containing a growth substrate and a semiconductor layer sequence, comprising the steps of
    providing a growth substrate;
    epitaxially growing a semiconductor layer sequence comprising a functional semiconductor layer on the growth substrate;
    applying a mask layer to partial regions of the semiconductor layer sequence to produce masked regions and unmasked regions;
    patterning the semiconductor layer sequence;
    implanting ions through the unmasked regions to produce implantation regions in the semiconductor wafer; and
    dividing the semiconductor wafer along the implantation regions, wherein at least part of the growth substrate is separated from the semiconductor wafer, and wherein the semiconductor layer is patterned prior to the ion implantation.

2. The method as claimed in claim 1, wherein hydrogen ions, helium ions, hydrogen ions and helium ions, or hydrogen ions and boron ions are implanted during the ion implantation.

3. The method as claimed in claim 1, wherein dividing is effected by thermal treatment.

4. The method as claimed in claim 3, wherein the thermal treatment is effected at a temperature within a range of 300° C. to 1200° C.

5. The method as claimed in claim 1, wherein the semiconductor layer sequence is based on a nitride compound semiconductor material.

6. The method as claimed in claim 1, wherein the functional semiconductor layer is a radiation-emitting layer or a radiation-detecting layer.

7. The method as claimed in claim 1, wherein the functional semiconductor layer has $In_xAl_yGa_{1-x-y}N$ where $0 \leq x \leq 1$, $0 \leq y \leq 1$ and $x+y \leq 1$.

8. The method as claimed in claim 1, wherein the growth substrate is a GaN substrate or an AlN substrate.

9. The method as claimed in claim 1, wherein the masked regions of the semiconductor layer sequence have a dimension (b) of 20 µm or less in at least one lateral direction.

10. The method as claimed in claim 1, wherein the implantation regions are arranged in a layer of the semiconductor layer sequence provided as a separating layer.

11. The method as claimed in claim 10, wherein the separating layer contains at least one element having a higher atomic number than gallium.

12. The method as claimed in claim 11, wherein the separating layer contains indium.

13. The method as claimed in claim 10, wherein the semiconductor layer sequence contains at least one diffusion barrier layer, adjacent to the separating layer, for the implanted ions.

14. The method as claimed in claim 13, wherein the diffusion barrier layer is a nitride compound semiconductor layer doped with Zn, Si or Fe.

15. The method as claimed in claim 13, wherein the semiconductor layer sequence contains diffusion barrier layers for the implanted ions on both sides of the separating layer.

16. The method as claimed in claim 10, wherein the separating layer is a tensile-stressed layer.

17. The method as claimed in claim 16, wherein the tensile-stressed separating layer is a nitride compound semiconductor layer containing aluminum.

18. The method as claimed in claim 16, wherein the tensile-stressed separating layer is an Si-doped nitride compound semiconductor layer.

19. The method as claimed in claim 10, wherein the separating layer is a semiconductor layer produced by lateral epitaxial overgrowth (ELOG).

20. The method as claimed in claim 19, wherein prior to growing the separating layer, an ELOG mask layer is applied to the growth substrate, a structure of said ELOG mask layer at least partly corresponding to the structure of the mask layer.

21. The method as claimed in claim 10, wherein the separating layer is formed from a semiconductor material in which the implanted ions have a greater diffusion coefficient than in a layer adjoining the separating layer.

22. The method as claimed in claim 21, wherein the separating layer is a p-doped nitride compound semiconductor layer.

23. The method as claimed in claim 1, wherein the semiconductor wafer is connected to a carrier substrate prior to dividing at a surface remote from the growth substrate.

24. The method as claimed in claim 23, wherein prior to connecting the semiconductor wafer to the carrier substrate, a planarizing interlayer is applied to the mask layer.

25. The method as claimed in claim 23, wherein prior to connecting the semiconductor wafer to the carrier substrate, an interlayer is applied to the unmasked regions of the semiconductor wafer, a thickness of said interlayer being greater than the thickness of the mask layer.

26. The method as claimed in claim 23, wherein the mask layer is removed prior to connecting the semiconductor wafer to the carrier substrate.

27. The method as claimed in claim 1, wherein a luminescence diode structure or laser diode structure is produced by the patterning.

28. The method as claimed in claim 27, wherein a stripe laser structure is produced.

29. The method as claimed in claim 28, wherein the stripe laser structure has a stripe width of between 1.5 µm and 3 µm inclusive.

30. The method as claimed in claim 1, wherein the mask layer envelops a structure produced by the patterning.

31. An optoelectronic component comprising a semiconductor layer sequence having a functional semiconductor layer,
in which the semiconductor layer sequence was separated from a growth substrate by a method as claimed in claim 1.

32. The optoelectronic component as claimed in claim 31, wherein the optoelectronic component is a luminescence diode or a laser diode.

33. A method for laterally dividing a semiconductor wafer containing a growth substrate and a semiconductor layer sequence, comprising the steps of:
providing a growth substrate;
epitaxially growing a semiconductor layer sequence comprising a functional semiconductor layer on the growth substrate;
applying a mask layer to partial regions of the semiconductor layer sequence to produce masked regions and unmasked regions;
implanting ions through the unmasked regions to produce implantation regions in the semiconductor wafer;
applying a planarizing interlayer to the mask layer;
connecting the semiconductor wafer to a carrier substrate at a surface remote from the growth substrate; and
dividing the semiconductor wafer along the implantation regions, wherein at least part of the growth substrate is separated from the semiconductor wafer;
wherein the semiconductor wafer is applied to the carrier substrate prior to dividing the semiconductor wafer and the planarizing interlayer is applied to the mask layer prior to connecting the semiconductor wafer to the carrier substrate.

34. A method for laterally dividing a semiconductor wafer containing a growth substrate and a semiconductor layer sequence, comprising the steps of:
providing a growth substrate;
epitaxially growing a semiconductor layer sequence comprising a functional semiconductor layer on the growth substrate;
applying a mask layer to partial regions of the semiconductor layer sequence to produce masked regions and unmasked regions;
implanting ions through the unmasked regions to produce implantation regions in the semiconductor wafer;
connecting the semiconductor wafer to a carrier substrate at a surface remote from the growth substrate;
applying an interlayer to the unmasked regions of the semiconductor wafer, a thickness of said interlayer being greater than the thickness of the mask layer; and
dividing the semiconductor wafer along the implantation regions, wherein at least part of the growth substrate is separated from the semiconductor wafer;
wherein the semiconductor wafer is connected to the carrier substrate prior to dividing the semiconductor wafer and the interlayer is applied to the unmasked regions of the semiconductor wafer prior to connecting the semiconductor wafer to the carrier substrate.

35. A method for laterally dividing a semiconductor wafer containing a growth substrate and a semiconductor layer sequence, comprising the steps of:
providing a growth substrate;
epitaxially growing a semiconductor layer sequence comprising a functional semiconductor layer on the growth substrate;
applying a mask layer to partial regions of the semiconductor layer sequence to produce masked regions and unmasked regions;
implanting ions through the unmasked regions to produce implantation regions in the semiconductor wafer;
connecting the semiconductor wafer to a carrier substrate at a surface remote from the growth substrate;
removing the mask layer from the partial regions of the semiconductor layer; and
dividing the semiconductor wafer along the implantation regions, wherein at least part of the growth substrate is separated from the semiconductor wafer;
wherein the semiconductor wafer is connected to the carrier substrate prior to dividing the semiconductor wafer and the mask layer is removed from the partial regions of the semiconductor layer prior to connecting the semiconductor wafer to the carrier substrate.

* * * * *